United States Patent [19]

Woodward

[11] 4,409,683
[45] Oct. 11, 1983

[54] PROGRAMMABLE MULTIPLEXER
[75] Inventor: Thomas R. Woodward, West Chester, Pa.
[73] Assignee: Burroughs Corporation, Detroit, Mich.
[21] Appl. No.: 322,462
[22] Filed: Nov. 18, 1981
[51] Int. Cl.$^3$ .................. H04J 3/02; H03K 17/00
[52] U.S. Cl. .................................. 370/112; 307/243
[58] Field of Search ............... 370/112, 113, 114, 46; 307/243, 244; 328/96, 97, 104, 154

[56] References Cited

U.S. PATENT DOCUMENTS

| 3,979,561 | 9/1976 | Hinkle et al. | 370/114 |
| 3,992,703 | 11/1976 | Luisi et al. | 307/243 |
| 4,122,311 | 10/1978 | Klatt et al. | 370/112 |
| 4,270,204 | 5/1981 | Gordon | 370/112 |

OTHER PUBLICATIONS

"Custom Design of a High Performance Most Multiplexer", by G. D. Shenton, Proceedings I.R.E.E. Australia, vol. 32, No. 6, Jun. 1971, pp. 204-213.

Primary Examiner—Douglas W. Olms
Attorney, Agent, or Firm—Charles J. Fassbender; J. Ronald Richbourg; Kevin R. Peterson

[57] ABSTRACT

Disclosed is a programmable multiplexer integrated on a semiconductor chip comprised of a plurality of fixed multiplexer circuits, each of which includes a plurality of data inputs, a plurality of control inputs, and an output for passing a signal from any one of the data inputs to the output in a fixed predetermined fashion in response to encoded signals on the control inputs; and associated with each of the fixed multiplexer circuits is a programmable memory for generating the encoded control signals by performing respective programmable transformation of one common address that is sent to all of the memories.

10 Claims, 5 Drawing Figures

Fig. 1 (Prior Art)
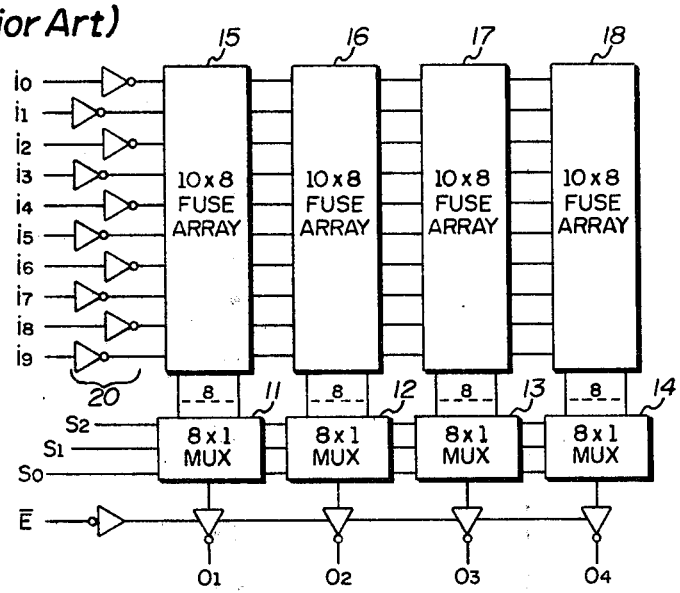
Fig. 2
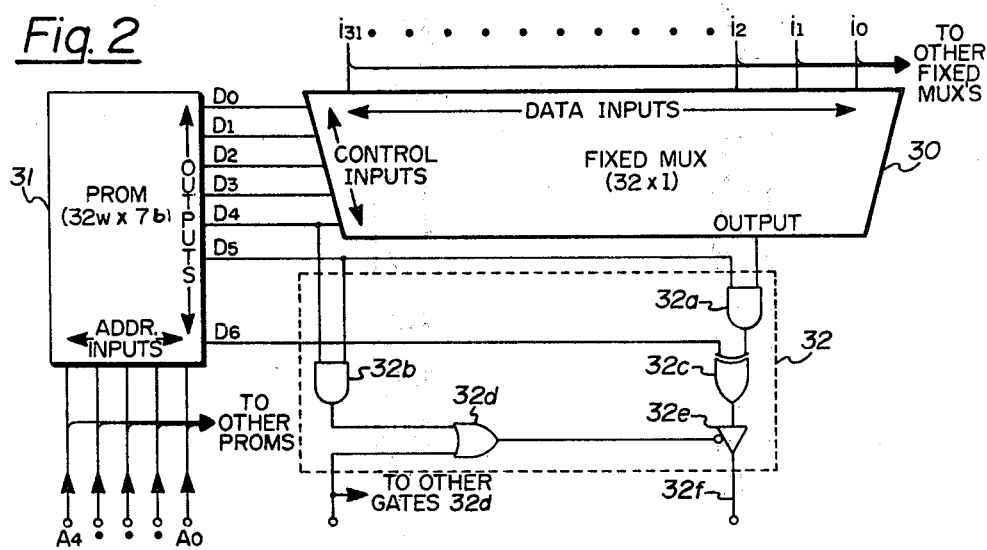
Fig. 3
| | | DATA INPUTS PER CHIP | SELECTIONS PER OUTPUT | FUSES PER OUTPUT | OUTPUTS PER CHIP | TOTAL FUSES PER CHIP | SAVINGS |
|---|---|---|---|---|---|---|---|
| ROW 1 → | PRIOR ART (Fig. 1) | 32 | 32 | 32 x 32 | 16 | 16,384 | ✕ |
| ROW 2 → | EMBOD. OF Fig. 2 | 32 | 32 | 32 x 5 | 16 | 2,560 | 14,124 |
| ROW 3 → | EMBOD. OF Fig. 2 | 32 | 32 | 32 x 7 | 16 | 3,584 | 12,800 |

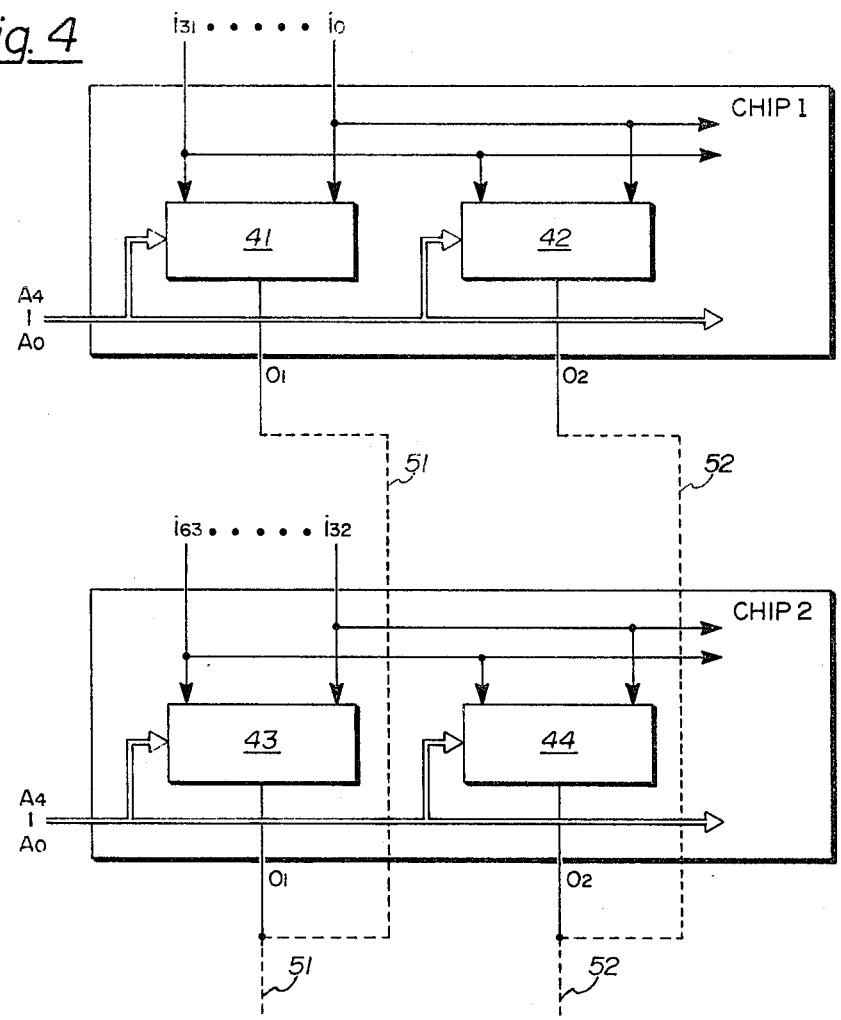

PROGRAMMABLE MULTIPLEXER

BACKGROUND OF THE INVENTION

This invention relates to the architecture of a particular type of digital logic circuit called a programmable multiplexer.

In general, practically all digital logic circuits are packaged on semiconductor chips in accordance with the particular function that they perform. See, for example, *The TTL Data Book for Design Engineers*, 2nd Edition, Texas Instruments, Section 1 page 9 wherein several logic circuit chips are listed according to their function, and in particular note the "data selector-multiplexer" chips since they relate directly to the subject of this invention.

Each data selector-multiplexer chip there listed contains one or more fixed multiplexer circuit which is herein defined as a circuit having a plurality of data inputs, a plurality of control inputs, and an output. In operation, control signals are applied to the control inputs, and in response the fixed multiplexer circuit selectively passes a signal from one of the data inputs to the output. In other words, the data inputs are multiplexed to the output in response to the control signals in a fixed predetermined fashion.

Typically, several fixed multiplexer circuits are fabricated on a single chip. See, for example, the Texas Instruments chips 54LS253 and 74LS253 in Section 7, page 369 of the above-cited reference. These chips contain two such circuits, each of which has four data inputs and one output; and the data inputs on both of those circuits are selected by control signals that are common to both circuits.

One significant limitation, however, to these 54LS253 and 74LS253 chips and other similar prior art chips containing several fixed multiplexer circuits is that they are too inflexible. More specifically, the data inputs which the several fixed multiplexer circuits select in response to the control signals cannot be picked in any desired combination. Instead, the data inputs which pass to the outputs in response to the control signals are fixed. Typically, in response to control signals encoded as a "binary one", all of the fixed multiplexer circuits select their "first" data input; in response to control signals encoded as a "binary two", all of the fixed multiplexer circuits select their "second" data input; etc.

To overcome this problem, a "programmable multiplexer" chip has been recently introduced into the market by a company called Monolithic Memories. This programmable multiplexer chip has a part number 29693, and its block diagram is illustrated in FIG. 1.

As there illustrated, this programmable multiplexer is comprised of four fixed multiplexer circuits 11–14 and a corresponding number of fusible link arrays 15–18. In operation, input signals $i_0$–$i_9$ are received on the chip by buffers 20; and their outputs are sent to the fusible link arrays. Outputs from the fusible link arrays 15–18 are then sent to the fixed multiplexer circuits 11–14 respectively.

Circuits 11–14 pass their inputs to their output in a fixed predetermined fashion in response to a common set of control signals $S_0$–$S_2$. But this 29693 chip is much more flexible than the aforementioned Texas Instruments 54LS253 and 74LS253 chips because the fuse arrays enable the input signals $i_0$–$i_8$ to be passed to the fixed multiplexer circuits 11–14 in any desired combination.

Suppose, for example, that it is desired to pass inputs $i_7$, $i_2$, $i_8$, and $i_0$ through the fixed multiplexer circuits 11, 12, 13 and 14 respectively in response to $S_0$, $S_1$, $S_2$ signals of 001. Assuming that a 001 code selects the first input on each of the fixed multiplexer circuits 11, 12, 13, and 14, then the above result is achieved by merely blowing the appropriate fuses in arrays 15, 16, 17, and 18 such that input $i_7$ is sent to the first input of fixed multiplexer circuit 11, input $i_2$ is sent to fixed multiplexer circuit 12, etc.

However, despite the above-described desirable feature of the FIG. 1 programmable multiplexer chip, that chip also has several very significant drawbacks. And these drawbacks, along with the features and advantages of the present invention, are described in detail in the following Detailed Description in conjunction with FIGS. 2–5.

Accordingly, a primary object of the present invention is to provide an improved programmable multiplexer chip as described in conjunction with FIGS. 2–5.

BRIEF SUMMARY OF THE INVENTION

This object is achieved in the present invention by providing a plurality of fixed multiplexer circuits and a corresponding number of programmable memories on a semiconductor chip. Each of the fixed multiplexer circuits includes a plurality of data inputs, a plurality of control inputs, and an output for passing a signal from any one of the data inputs to the output in a fixed predetermined fashion in response to encoded signals on the control inputs; and each of the memories includes an address input and parallel outputs for generating signals thereon as a programmable transformation of the memory address.

All of the fixed multiplexer circuits have their data inputs intercoupled together such that they receive the same data input signals; all of the memories have their address inputs intercoupled together such that they receive the same address; and the memories also have their outputs respectively coupled to the control inputs of the plurality of fixed multiplexer circuits. Thus, the encoded control signals for the plurality of fixed multiplexers are formed by respective programmable transformations of a memory address, which in turn enables any combination of data inputs to be passed to the fixed multiplexer circuit outputs.

BRIEF DESCRIPTION OF THE DRAWINGS

Various features and advantages of the invention will best be understood by reference to the following Detailed Description and accompanying drawings wherein:

FIG. 1 is a logic diagram, for comparison purposes, of a programmable multiplexer chip constructed according to the prior art;

FIG. 2 is a logic diagram of a programmable multiplexer chip constructed according to one preferred embodiment of the invention;

FIG. 3 is a chart which compares the number of fuses that are required to implement the programmable multiplexers of FIGS. 1 and 2;

FIG. 4 is a logic diagram illustrating the expandability of the data inputs of the programmable multiplexer chip of FIG. 2; and FIG. 5 is a chart illustrating the operation of the FIG. 4 logic diagram.

DETAILED DESCRIPTION OF THE INVENTION

Referring now to FIG. 2, one preferred embodiment of a programmable multiplexer chip constructed according to the invention will be described. This embodiment includes a plurality of identical fixed multiplexers, one of which is shown in FIG. 2 as indicated by reference numeral 30. All of the fixed multiplexer circuits have 32 data inputs, five control inputs, and one output; and they all have their data inputs coupled together such that they receive the same data input signals $i_0$–$i_{31}$.

Each of the fixed multiplexer circuits 30 has a separate programmable read-only memory 31 associated with it. Memory 31 contains thirty-two words, each of which is seven bits in length. These words are read from the memory via signals $A_0$–$A_4$ that are applied to the memory's address inputs. All of the memories have their address inputs coupled together to receive the same address signals $A_0$–$A_4$ in parallel.

Also associated with each of the fixed multiplexer circuits 30 and its memory 31 is a separate logic circuit, one of which is indicated by reference numeral 32. Each of these logic circuits includes a pair of AND gates 32a and 32b, an exclusive OR gate 32c, an OR gate 32d, and an output driver 32e. These components are interconnected to their respective fixed multiplexer circuit and memory as illustrated in FIG. 2.

In operation, address $A_0$–$A_4$ is sent to all of the memories 30 in parallel. Each of those memories responds by generating output signals $D_0$–$D_6$ as determined by the addressed word. In other words, signals $D_0$–$D_6$ are a programmable transformation of the address. Signals $D_0$–$D_4$ are then sent to the fixed multiplexer circuit 30 to control its output, whereas signals $D_4$–$D_6$ are sent to logic circuit 32 to control that circuit's output.

Suppose, as a specific example, that in response to a particular address, fixed multiplexer circuit 30 is to pass data input $i_2$ to its output. This is achieved by programming the addressed word in memory 31 such that output signals $D_0$–$D_4$ select input $i_2$. For that same memory address, however, the words in the other memories can be encoded differently; and thus any set of data inputs can be sent through the fixed multiplexer circuits in response to a particular memory address.

One important feature of the above-described programmable multiplexer chip is that it not only provides the programmable multiplexing function, but it does this with substantially less circuitry than the prior art required. In particular, the number of fuses which the FIG. 2 chip requires is substantially reduced.

This is evident by an inspection of FIG. 3 which compares the number of fuses that are required to implement a programmable multiplexer chip having thirty-two data inputs and sixteen outputs via the circuitry of FIGS. 1 and 2. Calculations for that chip according to the prior art of FIG. 1 are made in row 1; whereas calculations for that chip according to FIG. 2 are made in row 2.

As indicated in the leftmost column of FIG. 3, both embodiments have thirty-two data inputs; and as indicated in the next adjacent column, it is assumed for the purposes of this calculation that there are thirty-two multiplexing functions per output. In other words, it is assumed for the purposes of this comparison that there are five control signals going into each fixed multiplexer circuit. Those control signals have thirty-two combinations which direct each fixed multiplexer circuit to make thirty-two different selections.

Therefore, as shown in the next column, each fuse array in the FIG. 1 embodiment will contain 32×32 fuses. But by comparison, each programmable memory such as memory 31 in the FIG. 2 embodiment will only contain 32×5 fuses. That will provide thirty-two words of five bits each; and each of those five-bit words will pass one data input through the fixed multiplexer circuit.

Again, for the purposes of this comparison, this chip is assumed to have sixteen outputs. Therefore, the total number of fuses per chip in the FIG. 1 embodiment will be 32×32×16 or 16,384; whereas the total number of fuses in the FIG. 2 embodiment will only be 32×5×16 or 2,560. Consequently, with this invention there is a savings of 14,124 fuses!

Also, another important feature of this invention is that the logic circuit 32 in combination with memory 31 provides several additional functions which simply are not obtainable in the prior art. One of these functions is that the inverse of data inputs $i_0$–$i_{31}$ can be selectively transferred to the logic circuit's output 32f. Another of these functions is that a digital "1" or a digital "0" can be selectively sent to output 32f regardless of the state of the multiplexer's data inputs. And still another of these functions is that the number of data inputs that are multiplexed to a particular chip's output can be expanded.

Consider now the details of how these functions are obtained. Firstly, to pass the inverse of a particular data input to output 32f, memory 31 is programmed to generate signals $D_5$ and $D_6$ as a digital "11". A "1" for signal $D_5$ causes the outut of fixed multiplexer 30 to pass through AND gate 32a; and a "1" for signal $D_6$ causes EXCLUSIVE OR gate 32c to invert the output of AND gate 32a. That inverted signal is then sent to output 32f.

Note, by comparison, that a selected data input is sent directly to output 32f in response to signals $D_5$ and $D_6$ from memory 31 being programmed as a '10'. A "1" for signal $D_5$ causes the output of multiplexer 30 to pass through AND gate 32a; and a "0" value for signal $D_6$ causes the output of AND gate 32a to pass directly through EXCLUSIVE OR gate 32c and to output 32f.

Next, to generate a "0" on output 32f regardless of the state of the data inputs $i_0$–$i_{31}$, signals $D_5$ and $D_6$ from memory 31 are programmed as a "00". Signal $D_5$ being a "0" forces the output of AND gate 32a to a "0"; and signal $D_6$ being a "0" causes the "0" output of AND gate 32a to pass directly through EXCLUSIVE OR gate 32c.

Next, to generate a "1" on output 32f, signals $D_5$ and $D_6$ from memory 31 are programmed as a "01". Gate 32a generates a "0" on its output in response to signal $D_5$ being a "0"; and EXCLUSIVE OR gate 32c generates a "1" on its output in response to one of its inputs being "1".

To generate signals $D_5$ and $D_6$ in addition to signals $D_0$–$D_4$ requires two additional fuses per word in memory 31. Thus, as indicated in row 3 of FIG. 3, the total number of fuses per output is 32×7; and the total number of fuses per chip is 3,584. But this is still 12,800 fuses less than the number of fuses required by the prior art circuit of FIG. 1.

Next, to understand how the number of data inputs that are multiplexed to a particular chip's output can be increased, reference should be made to FIG. 4. In that figure, two identical programmable multiplexer chips which are constructed according to the invention are labeled as "chip 1" and "chip 2". Each of these chips contains all of the FIG. 2 circuitry repeated 16 times. Boxes 41, 42, 43 and 44 represent respective copies of that circuitry.

Data input signals $i_0$–$i_{31}$ are sent to circuits 41 and 42 on chip 1 where they are then multiplexed to respective outputs $O_1$ and $O_2$, each of which corresponds to an output 32f. Similarly, data input signals $i_{32}$–$i_{63}$ are sent to circuits 43 and 44 on chip 2 where they are then multiplexed to respective output $O_1$ and $O_2$. Outputs $O_1$ and $O_2$ from chips 1 and 2 are then interconnected by conductors 51 and 52.

With this circuit, any of the data input signals $i_0$–$i_{63}$ can be gated in any desired combination onto conductors 51 and 52. Suppose, for example, that it is desired to gate signals $i_0$ and $i_{63}$ onto conductors 51 and 52 respectively. To accomplish this, memory address $A_0$–$A_4$ is programmably transferred as indicated by row 1 in the chart of FIG. 5.

That row indicates that the memories 31 in circuits 42 and 43 are programmed to generate output signals $D_4$ and $D_5$ as a "10". This causes AND gate 32b to generate a "1" on its output; that "1" passes through OR gate 32d to driver 32f; and driver 32e must receive a "0" from gate 32d to be enabled. Consequently, driver 32d is disabled, which connects a tri-state high impedance to output 32f.

Since logic circuits 42 and 43 generate no signals on conductors 51 and 52, the signals on those conductors are determined solely by circuits 41 and 44. Consequently, signal $i_0$ is passed to conductor 51 by programming signals $D_0$–$D_4$ in circuit 41 to select input $i_0$ and by programming signals $D_5$ and $D_6$ to a "10". Similarly, signal $i_{63}$ is passed to conductor 52 by generating signals $D_1$–$D_4$ to select input $i_{63}$ and by generating signals $D_5$ and $D_6$ to a "10".

This expandability of the data inputs simply is not possible to obtain with the prior art chip of FIG. 1. There, all of the chip's outputs $O_1$–$O_4$ are either enabled or disabled together in response to one common signal E. Thus, when outputs $O_1$–$O_4$ from two of those chips are wire-ORed together, it is impossible to pass input signals from one of those chips to output $O_1$ and at the same time pass input signals from the other chip to output $O_2$.

Other examples of how any combination of the data input signals $i_0$–$i_{63}$ as well as their inverse and the internally generated "0" and "1" signals can be passed to conductors 51 and 52, are indicated in the remaining rows of FIG. 5. Row 2, for example, indicates how inputs $i_{63}$ and $i_0$ are respectively passed to conductors 51 and 52; row 3 indicates how the inverse of $i_0$ and a "0" are respectively generated on conductors 51 and 52; and row 4 indicates how a "1" and the inverse of signal $i_0$ are respectively generated on conductors 51 and 52. In each case, outputs $0_1$ and $0_2$ from chips 1 and 2 are selectively disabled as indicated by the encircled "10$\phi$" values of signals $D_4$, $D_5$, $D_6$, where "$\phi$" means don't care.

Various preferred embodiments of the invention, as well as the features and advantages thereof, have now been described in detail. In addition, however, many changes and modifications can be made to these details without departing from the nature and the spirit of the invention. For example, it is to be understood that programmable memory 31 may be constructed with a wide variety of technologies. For example, the fuses within memory 31 may be comprised of polysilicon and the memory address decoders and output drivers may be comprised of bipolar transistors such as those in the Intel 3628A 1K×8 bipolar programmable memory chip. See also the fused memory cells as described at Section 6.5.1 of the text *Semiconductor Memory Design and Application* by Gerald Luecke et al, 1973.

As another alternative, memory 31 may be constructed as an ultraviolet erasable memory in which each fuse is replaced by a floating gate field-effect transistor. That is, this embodiment would include no fuses at all; but instead, the fuses previously discussed in conjunction with rows 2 and 3 of FIG. 3 would be replaced by an equal number of floating gate field-effect transistors. In general, a bit in this type of memory is programmed to a "0" by selectively storing change on the floating gate of the particular field-effect transistor corresponding to that bit; and the memory is programmed to all "1s" by radiating all of the floating gate field-effect transistors with ultraviolet light. This type of memory construction is utilized, for example, in the Intel 2716 programmable memory chip. See also Section 6.5.4 of the above-cited Luecke et al text.

Accordingly, it is to be understood that the invention is not limited to said details but is defined by the appended claims.

What is claimed is:

1. An improved programmable multiplexer circuit integrated on a semiconductor chip comprised of:
   a plurality of fixed multiplexer means and a corresponding plurality of programmable memory means;
   each of said fixed multiplexer means including a plurality of data inputs, a plurality of control inputs, and an output for passing a signal from any one of said data inputs to said output in a fixed predetermined fashion in response to encoded signals on said control inputs;
   each of said memory means including address inputs and parallel outputs for generating signals thereon as a programmable transformation of address signals on said address inputs;
   means for carrying the same set of data input signals to the data inputs of all of said fixed multiplexer means in parallel;
   means for carrying the same set of address input signals to the address inputs of all of said memory means in parallel; and
   said plurality of memory means having their outputs respectively coupled to said control inputs of said plurality of fixed multiplexer means to provide said encoded control signals as respective programmable transformations of said same memory address.

2. A programmable multiplexer according to claim 1 and further including a plurality of logic circuit means corresponding in number and respectively coupled to said plurality of memory means for receiving said control signals therefrom; each of said logic circuit means having an output and being responsive to its respectively received control signals for selectively coupling a respective one of said multiplexer output signals or a tri-state impedance to its output.

3. A programmable multiplexer according to claim 2 wherein each of said logic circuit means further includes a means responsive to its respectively received control signals for selectively generating a logic zero or a logic one on its output regadless of the signal passed to said multiplexer output.

4. A programmable multiplexer according to claim 2 wherein each of said logic circuit means further includes a means responsive to its respectively received control signals for selectively coupling the inverse of a respective multiplexer output signal to its output.

5. A programmable multiplexer according to claim 1 wherein each of said memory means includes an array of fuse means for selectively programming said transformation of said address.

6. A programmable multiplexer according to claim 1 wherein each of said memory means includes an array of floating gate field-effect transistor means for selectively programming said transformation of said address.

7. A programmable multiplexer according to claim 1 wherein each of said memory means and fixed multiplexer means is comprised of a plurality of bipolar transistors.

8. A programmable multiplexer according to claim 1 wherein each of said memory means and fixed multiplexer means is comprised of a plurality of field-effect transistors.

9. An improved programmable multiplexer circuit integrated on a semiconductor chip comprised of:
   a plurality of fixed multiplexer means; each of said fixed multiplexer means including a plurality of data inputs, a plurality of control inputs, and an output for passing a signal from any one of said data inputs to said output in a fixed predetermined fashion in response to encoded signals on said control inputs; wherein
   associated with each of said fixed multiplexer means is a programmable memory means for generating said encoded control signals by performing respective programmable transformations of an address that is the same for all of said memory means.

10. An improved programmable multiplexer circuit according to claim 9 wherein associated with each of said memory means and corresponding multiplexer means is a logic circuit means having an output for selectively coupling thereto a tri-state high impedance or the inverse of the multiplexer's output in response to encoded control signals from the memory means.

* * * * *